United States Patent [19]

White, Jr. et al.

[11] Patent Number: 5,174,825
[45] Date of Patent: Dec. 29, 1992

[54] UNIFORM GAS DISTRIBUTOR TO A WAFER

[75] Inventors: Daniel White, Jr., Plano; Mary E. Weber, Dallas, both of Tex.

[73] Assignee: Texas Instruments Incorporated, Dallas, Tex.

[21] Appl. No.: 571,950

[22] Filed: Aug. 23, 1990

[51] Int. Cl.⁵ .............................................. C23C 16/00
[52] U.S. Cl. .................................. 118/715; 118/728; 239/590.3
[58] Field of Search ................................ 118/715, 728; 204/298.07, 298.33; 239/504, 590, 590.3; 156/345

[56] References Cited

U.S. PATENT DOCUMENTS

| 3,996,025 | 12/1976 | Gulden | 48/107 |
| 4,825,809 | 5/1989 | Mieno | 118/715 |

FOREIGN PATENT DOCUMENTS

| 60-12728 | 1/1985 | Japan | 118/728 |
| 60-39832 | 3/1985 | Japan | 156/345 |
| 60-189928 | 9/1985 | Japan | 118/715 |
| 60-192323 | 9/1985 | Japan | 118/728 |
| 62-13573 | 1/1987 | Japan | 118/728 |
| 62-290872 | 12/1987 | Japan | 118/728 |
| 63-76875 | 4/1988 | Japan | 118/728 |
| 63-152119 | 6/1988 | Japan | 118/715 |
| 64-82613 | 3/1989 | Japan | 118/728 |
| 1230125 | 4/1971 | United Kingdom | 239/590 |

Primary Examiner—Shrive Beck
Assistant Examiner—Terry J. Owens
Attorney, Agent, or Firm—Stanton C. Braden; Richard L. Donaldson; William E. Hiller

[57] ABSTRACT

A gas distribution system 140 includes a gas distribution chamber 142 and a gas distributor 154. Gas distribution chamber 142 includes an open end 144 and a closed end 146. A workpiece 148 is disposed adjacent closed end 146. Gas distributor 154 includes an outer collar 156 and an inner collar 158. Inner collar 158 has a continuously increasing cross-sectional diameter from a first predetermined point 160 to a second predetermined point 162. Gases are introduced through an inlet tube 150 disposed through an aperture in a platform 152 into the interior of inner collar 158 and toward workpiece 148. A diverter 164 diverts incoming gases from inlet tube 150.

35 Claims, 3 Drawing Sheets

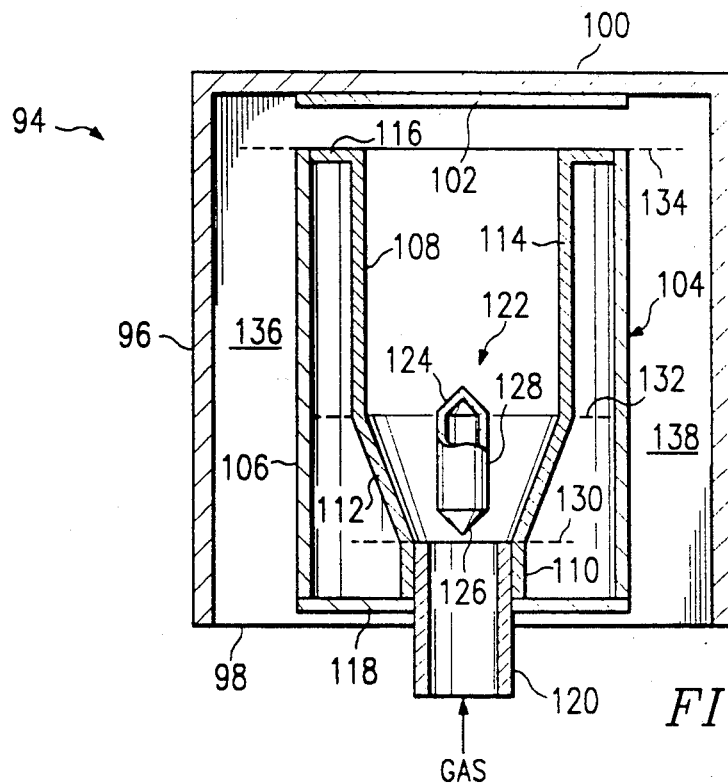
FIG. 4
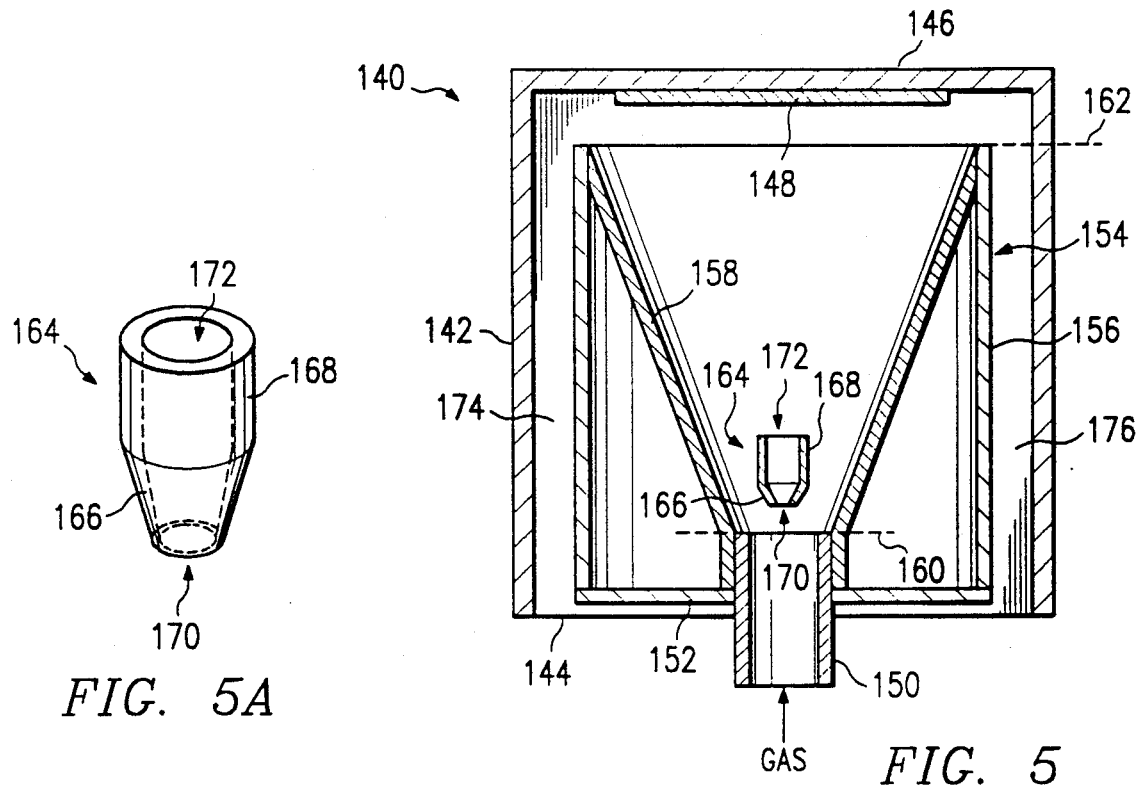
FIG. 5A
FIG. 5

UNIFORM GAS DISTRIBUTOR TO A WAFER

GOVERNMENT RIGHTS

The U.S. Government has a paid up license in this invention and rights in limited circumstances to require the patent owner to license others on reasonable terms as provided for by the terms of Contract Number F.33615-88-C-5448 awarded by the Department of Applied Research and Programs Administration.

TECHNICAL FIELD OF THE INVENTION

This invention relates to gas distribution, and more particularly to a gas distributor for uniformly distributing gases to a workpiece.

BACKGROUND OF THE INVENTION

In processing applications involving the deposition of gases, various films may be formed along the surface of a workpiece exposed to a gas. An example of such a workpiece is an integrated circuit wafer. A film formed on a wafer is typically formed by distributing a gas into a chamber holding the wafer. An inlet tube provides a laminar flow of gas to the chamber. Once the gas enters the chamber, it is desirable to maintain a laminar flow within the chamber so that the gas is evenly distributed to the wafer.

In the prior art, numerous efforts have been made to achieve a uniform gas distribution inside the chamber in order to produce a uniform deposition of gases across the wafer. Unfortunately, these efforts have commonly resulted in gas flow within the chamber having areas of nonuniform flow known as vortices. Each vortex within the flow of gases may cause a nonuniform distribution of gas to the wafer. As a result, a nonuniform film may be formed across the wafer. This nonuniform film has detrimental effects in that integrated circuits subsequently produced on the wafer may not function properly, if at all.

The prior art has heretofore included at least three different mechanisms used in an effort to achieve a uniform gas distribution inside the chamber. One example of a prior effort to provide uniform distribution includes the use of a baffle or flat plate placed in line with the inlet tube of the chamber. The baffle disrupts the gas flow to the center of the wafer and causes complex flow fields with turbulent-like vortices. Certain baffle configurations may produce flow fields that distribute gases relatively uniformly over the wafer and result in noncentrally distributed films. However, determination of such configurations is empirical and varies from reactor to reactor. Additionally, the complex flow fields may cause the system to be relatively unstable under varying operating conditions. Further, the gas distribution is poorly understood and controlled and the system may be difficult to scale to other geometries.

A second example of a prior art effort to provide uniform gas distribution within the wafer chamber is a shower head configuration. In this apparatus, the reactant gases are injected onto a plate with an array of pin holes which distributes the gases to the wafer. These systems have complex flow fields, and depending on the size of the holes, may cause the formation of jets which impinge the gases on the wafer. Thus, these systems are subject to drawbacks similar to the baffle design discussed above.

A final example of a prior art effort to obtain uniform gas distribution within the wafer chamber is the use of a dispersal ring. The dispersal ring is displaced around the inlet tube and introduces one of the reactant gases noncentrally. As a result, a noncentrally distributed film is formed with improved uniformity. However, the resulting flow fields induce a large vortex about the dispersal ring. As a result, a majority of the added reactant bypasses the wafer and is wasted. An additional drawback of the dispersal ring is that reactants are mixed in close proximity to the wafer. This yields low deposition rates in systems where homogeneous reactions are necessary to produce reactive precursors. Thus, the dispersal ring gives rise to inefficient use of the reactant gases. Additionally, the flow resulting from the dispersal ring yields problems similar to that of the baffle and shower head systems discussed above.

Therefore, a need has arisen for a method and apparatus for distributing gas to a workpiece such as a wafer or the like in a laminar flow in order to provide a uniform deposition of the gas across the entire workpiece.

SUMMARY OF THE INVENTION

In accordance with the present invention, a method and apparatus for providing a laminar flow of gas within a gas deposition chamber are provided which substantially reduce or eliminate the problems associated with prior art systems for distributing gas to a workpiece.

The present invention provides an apparatus for distributing gas to a workpiece. The invention includes a member having an aperture for receiving a gas and a collar in communication with the aperture. The collar comprises a section having a continuously increasing cross-sectional diameter from a first predetermined point to a second predetermined point and operable to direct gas received from the aperture to the workpiece.

The present invention may also include a diverting element disposed within an interior defined by a collar of a gas distributor. The gas distributor includes a member having an aperture for receiving a gas and a collar in communication with the aperture. The collar may have a constant cross-sectional diameter, or alternatively, may have a continuously increasing cross-sectional diameter from a first to a second predetermined point.

The present invention gives rise to numerous technical advantages over the prior art. One technical advantage of the present invention is that the flow fields resulting therefrom incur little or no vortex formation and are uniform. Thus, there is a reduction of the problems associated with the complex and turbulent flow fields implemented in the prior art. As an additional technical advantage, the uniform flow fields may be generated over a wide range of dimensions. Accordingly, there is the technical advantage that the dimensions of the apparatus of the present invention may be tailored for any particular workpiece size or item upon which gases are to be distributed. The uniform flow fields realized by the present invention further provide the technical advantage of uniform deposition of gas to the workpiece included within the system implementing the invention.

BRIEF DESCRIPTION OF THE DRAWINGS

For a more complete understanding of the present invention and the advantages thereof, reference is now made to the following description taken in conjunction with the accompanying drawings in which:

FIG. 4 illustrates a cross-sectional view of a gas distribution system of the present invention having a diverter and further having a segmented inner collar;

FIG. 5 illustrates a cross-sectional view of the preferred embodiment of the present invention having a hollow diverter; and FIG. 5A illustrates a perspective view of a diverter utilized in the present invention.

DETAILED DESCRIPTION OF THE INVENTION

Figure 1A:
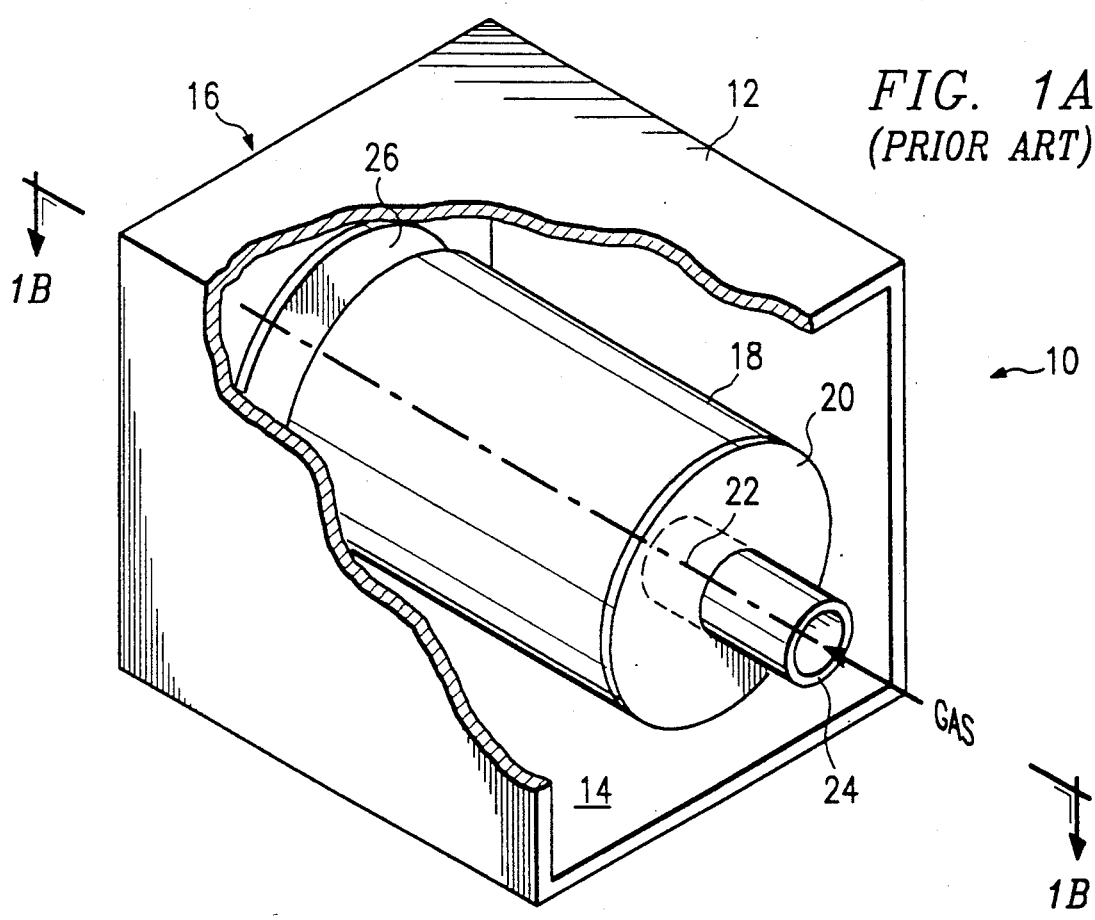
FIG. 1A illustrates an elevational view of a prior art gas distribution system.

FIG. 1A illustrates a prior art gas distribution system denoted generally at 10. System 10 includes a gas distribution chamber 12 which is shown as a parallelogram for exemplary purposes. It should be understood that gas distribution chamber 12 alternatively may be circularly cylindrical in shape. Gas distribution chamber 12 includes an open end 14 and a closed end 16. Gas distribution chamber 12 further includes a gas distributor 18 therein. Gas distributor 18 is illustrated as a circularly cylindrical device extending from open end 14 to closed end 16 of gas distribution chamber 12. Gas distributor 18 is typically on the order of 4.0 inches in cross-sectional diameter. Gas distributor 18 includes a platform 20 having an aperture 22 formed therein. Platform 20 operates in general to enclose the end of gas distributor 18. Additionally, an inlet tube 24 typically having a diameter of 1.0 inches is disposed through aperture 22 of platform 20 and extends within the interior of gas distributor 18. A workpiece 26 is adjacent closed end 16 within gas distribution chamber 12. Workpiece 26 is also proximate an open distribution end 27 of gas distributor 18. Typically, workpiece 26 comprises an integrated circuit wafer or the like. A wafer is commonly on the order of 4.0 inches in diameter.

The operation of prior art gas distribution system 10 is as follows. A workpiece 26 such as an integrated circuit wafer is disposed at closed end 16 of gas distribution chamber 12. Thereafter, a reactant gas is introduced into an open end of inlet tube 24. The gas is directed via gas distributor 18 toward workpiece 26. The gas contacts workpiece 26 and flows generally in an outward radial fashion therefrom. Consequently, gas is directed toward the outside walls of gas distribution chamber 12 and is able to exhaust through open end 14.

Figure 1B:
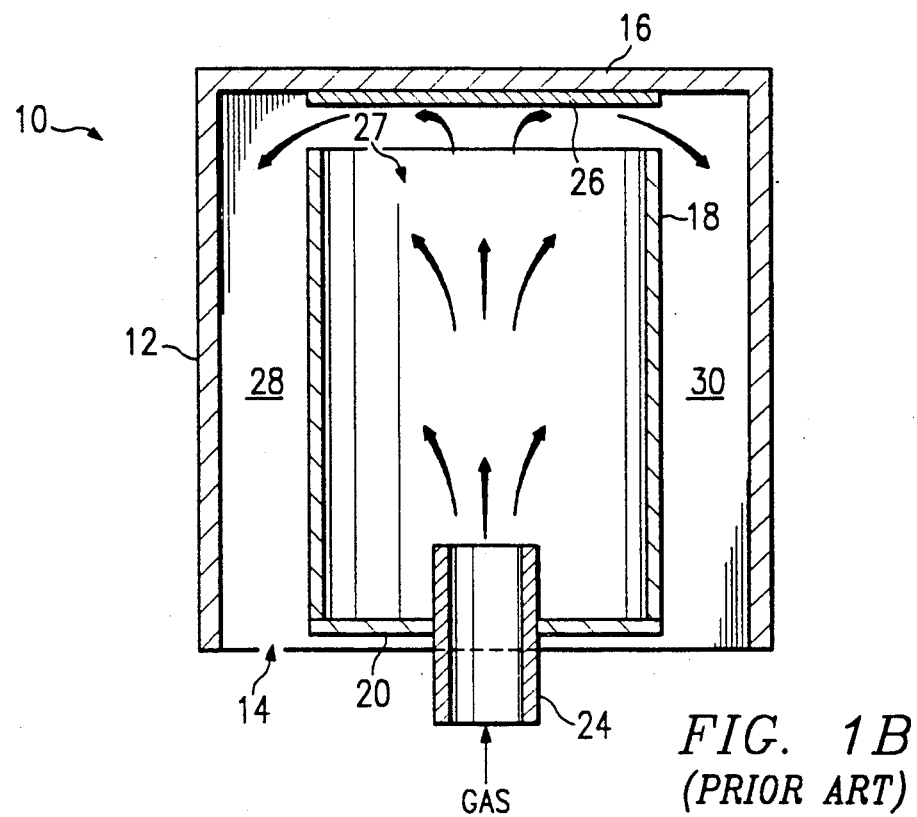
FIG. 1B illustrates the prior art gas distribution system of FIG. 1A along line 1B.

FIG. 1B illustrates a cross-sectional view of prior art gas distribution system 10 of FIG. 1 along line 1B. The flow and general distribution of gas is shown within FIG. 1B in the form of widened arrows within the figure. From this perspective, it may be appreciated that gas introduced into gas distributor 18 via inlet tube 24 flows through distribution end 27 toward workpiece 26. Upon making contact with workpiece 26, the gas flows in a radial outward fashion toward exhaust areas 28 and 30 defined between gas distribution chamber 12 and gas distributor 18.

Three separate and independent factors are known in the art to affect the number of vortices which may occur within the flow of gases from inlet tube 24 through gas distributor 18. These factors are discussed immediately below.

The first factor affecting vortex formation is the expansion length of the gas distribution system. This length is defined as the distance between the point of entry of the gas into gas distributor 18 and the location of workpiece 26. Fewer vortices generally occur where the expansion length is maximized. A second parameter affecting generation of vortices is the expansion ratio of the system. The expansion ratio is defined as the ratio of the cross-sectional diameter of the area from where the gas enters gas distributor 18 (i.e., the cross-sectional diameter of inlet tube 24) to the cross-sectional diameter of distribution end 27. In the prior art, it has been determined that generally a ratio of inlet tube 24 to distribution end 27 which approaches a value of one gives rise to a lesser amount of vortices within gas distributor 18. Thus, in the ideal situation, inlet tube 24 would have a cross-sectional diameter the same as that of distribution end 27. However, the dimensions of the devices existing in the prior art often provide for a less than optimum expansion ratio. A third parameter affecting generation of vortices within gas distributor 18 is the flow rate or Reynolds number of the gas introduced thereto. In particular, a higher flow rate gives rise to a greater chance of generation of vortices within gas distributor 18. Thus, from the above, it may be appreciated that the combination of expansion ratio, expansion length and flow rate are all interactive in the probability of vortex occurrence within gas distributor 18.

The preferred embodiments of the present invention are illustrated in FIGS. 2-5 of the drawings, like numerals being used to refer to like and corresponding parts of the various drawings.

Figure 2:
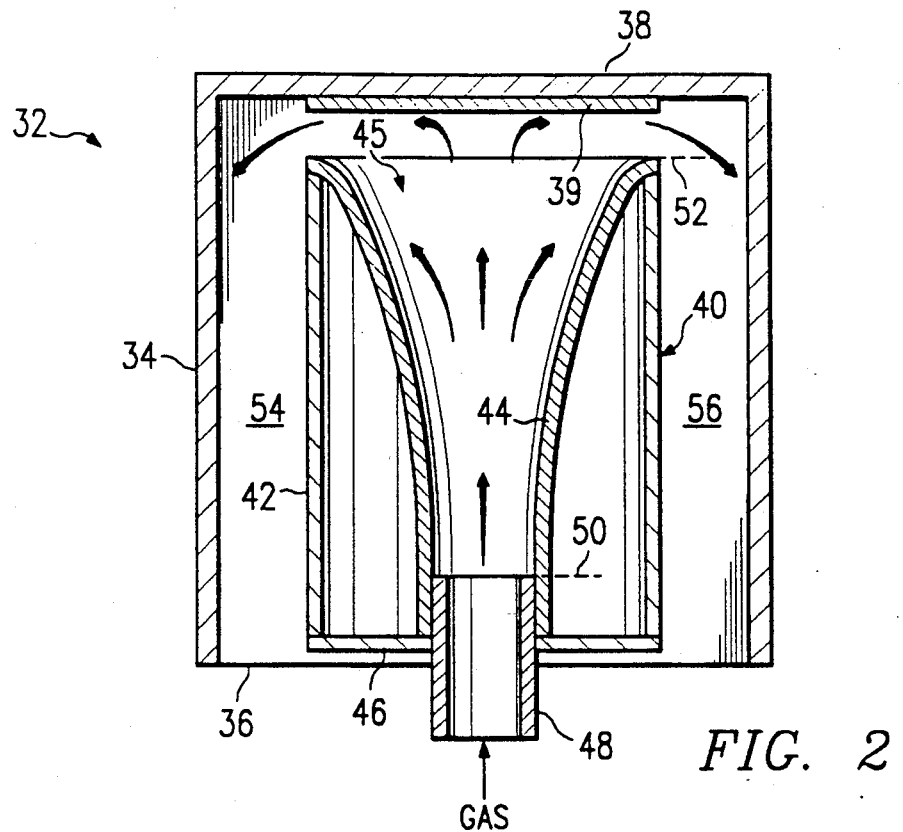
FIG. 2 illustrates a cross-sectional view of a gas distribution system constructed in accordance with the present invention.

FIG. 2 illustrates a cross-sectional diagram of a gas distribution system 32 constructed in accordance with the present invention. Externally, gas distribution system 32 appears the same as that discussed in connection with FIG. 1A. Thus, system 32 includes a gas distribution chamber 34 having an open end 36 and a closed end 38. Further, a workpiece 39 such as an integrated circuit wafer is disposed at closed end 38. Workpiece 39 is typically circular and has a diameter on the order of 4.0 inches. Alternative diameters for workpiece 39 may also be used such as a 6.0 inch diameter wafer. Further, workpiece 39 may comprise any other element where it is desirable to expose the element to a gas. A gas distributor 40 is disposed within gas distribution chamber 34 and includes an outer collar 42 and an inner collar 44. Outer collar 42 is typically a circularly cylindrical device having a cross-sectional diameter on the order of 4.0 inches. Inner collar 44 is generally a horn-shaped structure extending toward workpiece 39 and having an open distribution end 45. A platform 46 having an aperture centered therein is disposed adjacent collars 42 and 44. Platform 46 operates generally to enclose one end of gas distributor 40. Further, an inlet tube 48 is disposed through the aperture of platform 46 and extends within the interior of inner collar 44. Inlet tube 48 typically has a cross-sectional diameter on the order of 1.0 inches.

Numerous diameter dimensions are provided for herein. Unless otherwise stated, it should be understood that these references are to the inner diameter of the respective apparatus being discussed. Accordingly, the thickness of the respective apparatus will have no bearing on the (inner) diameter being described.

The extension of inlet tube 48 within inner collar 44 defines a point where gas will be permitted to expand within inner collar 44. In the preferred implementation of the present invention, this point coincides with a first predetermined point 50 within the interior of inner collar 44. The first predetermined point 50 is defined herein as the point at which the cross-sectional area of inner collar 44 begins to increase, as discussed in more detail below. Inner collar 44 extends in a direction from first predetermined point 50 to a point defined as a second predetermined point 52. In the embodiment of FIG. 2, second predetermined point 52 is proximate workpiece 39. Second predetermined point 52 is on the order of 0.25 inches from workpiece 39. In accordance with these definitions, the length between first and second predetermined points 50 and 52 is the expansion length for system 32. In the embodiment of FIG. 2, the expansion length is on the order of 3.0 inches.

The cross-sectional diameter of inner collar 44 at second predetermined point 52 is on the order of 4.0 inches. Thus, the expansion ratio for system 32 is on the order of 1:4 which is similar to that of the prior art system 10 of FIGS. 1A–1B. However, unlike prior art system 10, it may be further appreciated from FIG. 2 that the cross-sectional diameter of inner collar 44 is continuously increasing along this expansion length from first predetermined point 50 to second predetermined point 52. In particular, the cross-sectional diameter of inner collar 44 increases in an exponential fashion thereby defining a horn-shaped structure. As a result of this structure, gases introduced into inlet tube 48 are permitted to flow with less disturbance toward workpiece 39. Consequently, the present invention provides significantly fewer or no vortices within the interior of inner collar 44 and a more even distribution of gas at workpiece 39. Indeed, experimental use of the embodiment of FIG. 2 has produced relatively uniform distribution of gas across workpiece 39 at Reynolds numbers up to 20. After contacting workpiece 39, the gases flow in an outward radial fashion into exhaust areas 54 and 56 defined between gas distribution chamber 34 and outer collar 42.

The materials used to construct the various components of gas distribution system 32 may be selected by one skilled in the art. The particular materials should be compatible with the chemistry of the gases and reactions to be implemented by the system. Exemplary materials include quartz to minimize surface reactions, or metals where surface reactions are of a lesser concern.

Figure 3:
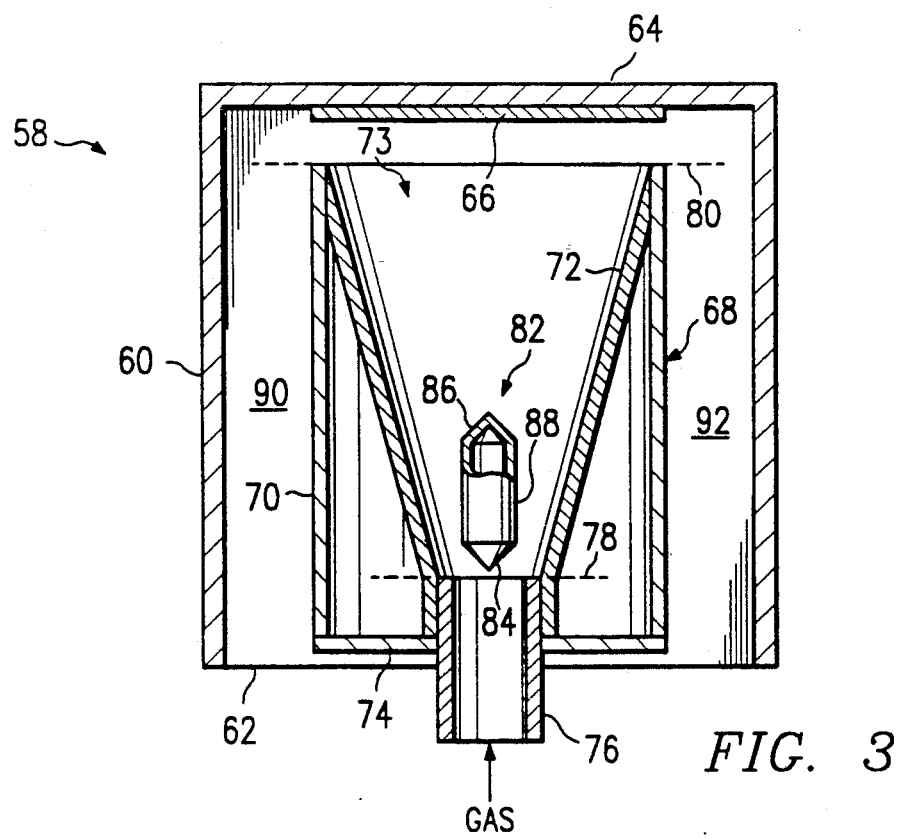
FIG. 3 illustrates a cross-sectional view of a gas distribution system constructed in accordance with the present invention having a diverter disposed therein.

FIG. 3 illustrates a generally cross-sectional diagram of a gas distribution system 58 constructed in accordance with the present invention. Gas distribution system 58 includes a gas distribution chamber 60 having an open end 62 and a closed end 64. Further, a workpiece 66 is disposed at closed end 64. Typically, workpiece 66 comprises an integrated circuit wafer having a diameter on the order of 4.0 inches. A gas distributor 68 is disposed within gas distribution chamber 60 and includes an outer collar 70 and an inner collar 72. Gas distributor 68 is preferably circularly cylindrical in shape and has a cross-sectional diameter of approximately 4.0 inches. Inner collar 72 is primarily frusto-conical in shape and terminates in an open distribution end 73. A platform 74, having an aperture centered therein, is disposed adjacent collars 70 and 72 thereby enclosing one end of gas distributor 68. An inlet tube 76 is disposed through the aperture of platform 74 and extends within the interior of inner collar 72. Inlet tube 76 typically has a cross-sectional diameter on the order of 1.0 inches for a workpiece having a 4.0 inch diameter.

The extension of inlet tube 76 with an inner collar 72 coincides with or approximately with a first predetermined point 78 within the interior of inner collar 72. First predetermined point 78 is defined as the point at which the cross-sectional diameter of inner collar 72 begins to increase. A small portion of outer collar 72 between first predetermined point 78 and platform 74 is circularly cylindrical and abuts inlet tube 76. Inner collar 72 extends in a direction from first predetermined 78 to a second predetermined point 80 proximate workpiece 66. Second predetermined point 80 is on the order of 0.25 inches from workpiece 66. The expansion length between first and second predetermined points 78 and 80 is on the order of 3.0 inches.

The cross-sectional diameter of inner collar 72 at second predetermined point 80 is on the order of 4.0 inches. Thus, the expansion ratio for system 58 is on the order of 1:4. From the perspective of FIG. 3, it may be appreciated that the cross-sectional diameter of inner collar 72 is continuously increasing along the expansion length from first predetermined point 78 to second predetermined point 80 in a linear fashion. As a result, gases introduced into inlet tube 76 are permitted to flow with less disturbance toward workpiece 66. Consequently, the embodiment of FIG. 3 provides significantly fewer or no vortices within the interior inner collar 72 and a more even distribution of gas at workpiece 66.

Gas distributor 58 illustrated in FIG. 3 further includes a diverter 82 centrally disposed within inner collar 72. Diverter 82 is shown in a cutaway perspective for illustrative purposes. Diverter 82 includes a first conical end 84 and a second conical end 86. A circularly cylindrical portion 88 is disposed between first and second conical ends 84 and 86. Diverter 82 may be supported by support members (not shown) connected between diverter 82 and inner collar 72. Preferably, three support members are used with each member placed 120 degrees apart from one another around the outer perimeter of cylindrical portion 88. In the preferred embodiment, conical ends 84 and 86 on the order of 0.75 inches in length while circularly cylindrical portion is also on the order of 0.75 inches in length. Further, circularly cylindrical portion 88 has a cross-sectional diameter on the order of 1.0 inches.

Diverter 82 operates to direct gas flow received from inlet tube 76 in an outward fashion toward workpiece 66. As a result, gases contact workpiece 66 in a non-central fashion so that a non-uniform film does not form at the center of workpiece 66. Experimental use of the embodiment of FIG. 3 has produced relatively uniform distribution of gas across workpiece 66 at Reynolds numbers up to 100. After contacting workpiece 66, the gases flow in an outward radial fashion into exhaust areas 90 and 92 defined between gas distribution chamber 60 and outer collar 70.

The materials used to construct the components of system 58 may again be chosen by one skilled in the art. These materials should be compatible with the chemical environment implemented within system 58.

FIG. 4 illustrates a generally cross-sectional diagram of an alternative gas distribution system 94 constructed in accordance with the present invention. The embodiment of FIG. 4 includes various components similar to those of the embodiment illustrated in FIG. 3. Accordingly, gas distribution system 94 includes a gas distribution chamber 96 having an open end 98 and a closed end 100. A workpiece 102 is disposed adjacent closed end 100.

Gas distribution system 94 includes a gas distributor 104 for distributing gases to workpiece 102. Gas distributor 104 includes an outer collar 106 and a segmented inner collar 108. Segmented inner collar 108 includes generally four segments 110, 112, 114 and 116. Thus, segmented inner collar 108 generally includes a frusto-conical section (segment 112) between two circularly cylindrical sections (segments 110 and 114). It should be noted that segments 110, 112, 114 and 116 may be formed of a contiguous piece but are defined as separate segments for purposes of explanation herein.

A platform 118 having an aperture therein is disposed adjacent both inner and outer collars 106 and 108. An inlet tube 120 is disposed through the aperture of front platform 118 and extends within the interior of inner 108. A diverter 122 is centrally mounted within the interior of segmented inner collar 108. Diverter 122 is constructed in a fashion like that of diverter 82 discussed in connection with FIG. 3. Accordingly, diverter 122 includes a first conical end 124, a second conical end 126 and a circularly cylindrical portion 128 therebetween.

In the embodiment of FIG. 4, inlet tube 120 is inserted into the interior of gas distributor 104 to a distance equal to the length of segment 110 of segmented inner collar 108. This internal extension coincides with a first predetermined point 130 within gas distributor 104. First predetermined point 130 defines the point at which segmented inner collar 108 begins to increase in cross-sectional diameter. The cross-sectional diameter of inner collar 108 at first predetermined point is on the order 1.25 inches. As apparent from FIG. 4, the cross-sectional diameter of segmented inner collar 108 is continuously increasing over segment 112 which extends between first predetermined point 130 and a second predetermined point 132. The cross-sectional diameter of inner collar 108 at second predetermined point 132 is on the order 2.0 inches.

Segment 114 extends from second predetermined point 132 to a third predetermined point 134 proximate Workpiece 102. Third predetermined point 134 is on the order of 0.25 inches away from workpiece 102. The distance between first predetermined point and second predetermined point 130 and 132 is on the order of 1.0 inches. Further, the distance between second predetermined point 132 and third predetermined point 134 is on the order of 2.0 inches. In this embodiment, the expansion length is defined as the distance between first predetermined point 130 and third predetermined point 134 although inner collar 108 expands in cross-sectional diameter only between points 130 and 132.

From the above, it may be appreciated that gases directed into inlet tube 120 toward workpiece 102 initially are diverted by diverter 122 and expand along first segment 112 between first predetermined point 130 and second predetermined point 132. Thereafter, the gases are distributed between second predetermined point 132 and third predetermined point 134 along segment 114 which has a constant, rather than continuously increasing, cross-sectional diameter. Experimental use of the embodiment of FIG. 3 has produced relatively uniform distribution of gas across workpiece 102 at Reynolds numbers up to 100. The diameter of quality and efficient gas distribution across workpiece 102 has been observed to approximate the cross-sectional diameter of inner collar 108 at second predetermined point 132. Thus, the embodiment of FIG. 3 provides optimal gas distribution where the desirable distance or diameter of distribution is approximately equal to the cross-sectional diameter of inner collar 108 at second predetermined point 132. After contacting workpiece 102, gases flow in an outward radial fashion into exhaust areas 136 and 138 defined between gas distribution chamber 96 and outer collar 106.

FIG. 5 illustrates a cross-sectional diagram of a gas distribution system 140 constructed as the preferred embodiment of the present invention. Gas distribution system 140 includes various components similar to those discussed in connection with the embodiment of FIGS. 3 and 4. Thus system 140 includes a gas distribution chamber 142 having an open end 144 and a closed end 146. A workpiece 148 such as an integrated circuit wafer is disposed adjacent closed end 146. An inlet tube 150 is disposed through an aperture of a platform 152 and extends within the interior of a gas distributor 154.

Gas distributor 154 includes an outer collar 156 and an inner collar 158 The interior extension of inlet tube 150 coincides with a first predetermined point 160. First predetermined point 160 is the point where the cross-sectional diameter of inner collar 158 begins to increase. A small segment of inner collar 158 extends between first predetermined point 160 and platform 152. This segment is circularly cylindrical and abuts with inlet tube 150. Inner collar 158 further extends toward workpiece 148 and terminates at a second predetermined point 162. The distance between second and third predetermined points 160 and 162 is on the order 3.0 inches. The cross-sectional diameter of inner collar 158 at second predetermined point 162 is on the order of 4.5 inches. It should be noted that in the embodiment of FIG. 5, this cross-sectional diameter exceeds that of the 4.0 inch diameter workpiece 148. Experimental use of a cross-sectional diameter at second predetermined point 162 greater than that of workpiece 148 has yielded improved uniformity of gas distribution across workpiece 148 at larger Reynolds numbers.

Gas distribution system 140 further includes a hollowed diverter 164 (shown in a perspective view in FIG. 5A) centrally disposed within inner collar 158. Hollowed diverter 164 is affixed within inner collar 158 in the same manner as diverter 82 discussed in connection with FIG. 3. As shown in FIGS. 5 and 5A, hollowed diverter 164 includes a frusto-conical section 166 and a circularly cylindrical section 168. Hollowed diverter 164 further includes an inlet 170 and an outlet 172. In the preferred embodiment, frusto-conical section 166 is on the order of 0.75 inches in length while circularly cylindrical section 168 is on the order of 0.5 inches in length. Further, inlet 170 is on the order of 0.25 inches in inner diameter while outlet 172 is on the order of 0.875 inches in inner diameter. Additionally, the sloped edges of frusto-conical section 166 in the preferred embodiment are within ten percent in slope of the slope of inner collar 158. The thickness of diverter 164 is preferably tapered to be thinner at inlet 170 in comparison to the thickness at outlet 172. This tapering minimizes flow disturbance as gases flow through and around diverter 172.

As a result of sections 166 and 168, gas entering inlet tube 150 and directed toward hollowed diverter 164 is partially diverted around the outside diverter 164 while a certain portion of gas is allowed to pass therethrough. Consequently, gas flow is directed both toward the outer perimeter and central portions of workpiece 148.

Experimental use of the embodiment of FIG. 5 has produced relatively uniform distribution of gas across workpiece 148 at Reynolds numbers up to 200. After contacting workpiece 148, the gases flow in an outward radial fashion into exhaust areas 174 and 176 defined between gas distribution chamber 142 and outer collar 156.

It should also be noted that the numerous diverters discussed herein need not necessarily be implemented with a gas distributor having an increasing cross-sectional diameter. Thus, either diverter 82 of FIGS. 3 and 4 or diverter 172 of FIG. 5 may be combined with a gas distributor having an inner collar with a constant cross-sectional diameter such as that shown in FIGS. 1A and 1B. This combination of apparatus represents yet additional possible embodiments included within the present invention.

From the above, it may be appreciated that the present invention provides an improved gas distributor operable to receive gas at an inlet tube and direct the same to a workpiece such as an integrated circuit wafer or the like. The inventive structure and methodologies described herein provide for a significantly reduced number of vortices within the gas distribution chamber resulting in a more uniform deposition of gas upon the workpiece. It should also be noted that although the present invention has been described in detail, it should be understood that various changes, substitutions and alterations may be made hereto without departing from the spirit and scope of the invention as defined by the appended claims. For example, the dimensions and general shapes provided for herein may be altered by one skilled in the art to provide various desired results. Further, although the "first predetermined point" has been defined herein to coexist at the point of interior extension of a respective inlet tube, it should be understood that the first predetermined point could exist at a point of either lesser or greater extension within the interior of a respective inner collar. Thus, the point where the inner collar begins to increase in cross-sectional diameter may be shifted while not departing from the scope of the invention as defined by the following claims.

What is claimed is:

1. An apparatus for distributing gas to a workpiece, comprising:
    a member having an aperture for receiving a gas;
    a collar in communication with said aperture, said collar extending from said aperture toward the workpiece and having an open end proximate the workpiece and operable to direct gas received from said aperture to the workpiece; and
    a diverting element disposed within an interior defined by said collar wherein said diverting element comprises:
        a first conical section;
        a second conical section; and
        a circularly cylindrical section between said first and second conical sections.

2. The apparatus of claim 1 and further comprising an inlet tube disposed through said aperture and extending within said interior defined by said collar.

3. The apparatus of claim 1 wherein said diverting element is disposed proximate said aperture.

4. The apparatus of claim 1 wherein the workpiece comprises an integrated circuit wafer.

5. The apparatus of claim 1 and further comprising an inlet tube disposed through said aperture, and wherein said diverting element is disposed proximate said inlet tube.

6. The apparatus of claim 1 wherein said collar comprises a collar section having a continuously increasing cross-sectional diameter from a first predetermined point to a second predetermined point, and wherein said first conical section has a slope within ten percent of the slope of said collar section.

7. An apparatus for distributing gas to a workpiece, comprising:
    a member having an aperture for receiving a gas;
    a collar in communication with said aperture, said collar extending from said aperture toward the workpiece and having an open end proximate the workpiece and operable to direct gas received from said aperture to the workpiece;
    a diverting element disposed within an interior defined by said collar and intermediate said open end and said aperture; and
    an inlet tube disposed through said aperture, and wherein said diverting element is disposed proximate said inlet tube.

8. The apparatus of claim 7 wherein said collar comprises a collar section having a continuously increasing cross-sectional diameter from a first predetermined point to a second predetermined point, and wherein said diverting element comprises a conical section having a slope within ten percent of the slope of said collar section.

9. The apparatus of claim 7 wherein said collar comprises a collar section having a continuously increasing cross-sectional diameter from a first predetermined point to a second predetermined point, and wherein said diverting element comprises a frusto-conical section having a slope within ten percent of the slope of said collar section.

10. The apparatus of claim 7 wherein said diverting element is hollow such that a portion of gas received from said aperture may pass therethrough and toward the workpiece.

11. The apparatus of claim 7 wherein the workpiece comprises an integrated circuit wafer.

12. An apparatus for distributing gas to a workpiece, comprising:
    a member having an aperture for receiving a gas;
    a collar in communication with said aperture, said collar extending from said aperture toward the workpiece and having an open end proximate the workpiece and operable to direct gas received from said aperture to the workpiece; and
    a diverting element disposed within an interior defined by said collar wherein said diverting element comprises:
        a frusto-conical section having a smaller diameter end toward the aperture and a larger diameter end toward the workpiece; and
        a circularly cylindrical section extending from said large diameter end toward the workpiece.

13. The apparatus of claim 12 and further comprising an inlet tube disposed through said aperture, and wherein said diverting element is disposed proximate said inlet tube.

14. The apparatus of claim 12 wherein said collar comprises a collar section having a continuously increasing cross-sectional diameter from a first predetermined point to a second predetermined point, and wherein said frusto-conical section has a slope within ten percent of the slope of said collar section.

15. The apparatus of claim 12 and further comprising an inlet tube disposed through said aperture and extending within said interior defined by said collar.

16. The apparatus of claim 12 wherein the workpiece comprises an integrated circuit wafer.

17. The apparatus of claim 12 wherein said diverting element is hollow such that a portion of gas received from said aperture may pass therethrough and toward the workpiece.

18. An apparatus for distributing gas to a workpiece, comprising:
   a member having an aperture for receiving a gas;
   a collar in communication with said aperture, said collar extending from said aperture toward the workpiece and having an open and proximate the workpiece and operable to a direct gas received from said aperture to the workpiece; and
   a diverting element disposed within an interior defined by said collar and intermediate said open end and said aperture wherein said diverting element is hollow such that a portion of gas received from said aperture may pass therethrough and toward the workpiece.

19. The apparatus of claim 18 wherein the workpiece comprises an integrated circuit wafer.

20. An apparatus for distributing gas to a workpiece, said workpiece having a selected diameter, comprising:
   a member having an aperture for receiving a gas;
   a collar in communication with said aperture, said collar comprising a section having a continuously increasing cross-sectional diameter from a first predetermined point to a second predetermined point and operable to direct gas received from said aperture to the workpiece; and
   a diverting element disposed within an interior defined by said collar wherein said diverting element comprises:
      a first conical section;
      a second conical section; and
      a circularly cylindrical section between said first and second conical sections.

21. The apparatus of claim 20 wherein said second predetermined point is proximate the workpiece.

22. The apparatus of claim 20 wherein the cross-sectional diameter of said collar section at said second predetermined point is greater than the diameter of said workpiece.

23. The apparatus of claim 20 wherein said collar section comprises a first collar section, and wherein said collar further comprises a second collar section extending from said second predetermined point toward a third predetermined point proximate the workpiece, said second collar section having a constant cross-sectional diameter.

24. The apparatus of claim 20 wherein the workpiece comprises an integrated circuit wafer.

25. The apparatus of claim 20 wherein said continuously increasing cross-sectional diameter comprises an exponentially increasing cross-sectional diameter.

26. The apparatus of claim 20 wherein said continuously increasing cross-sectional diameter comprises a linearly increasing cross-sectional diameter.

27. An apparatus for distributing gas to a workpiece, said workpiece having a selected diameter, comprising:
   a member having an aperture for receiving a gas;
   a collar in communication with said aperture, said collar comprising a section having a continuously increasing cross-sectional diameter from a first predetermined point to a second predetermined point and operable to direct gas received from said aperture to the workpiece; and
   a diverting element disposed within an interior defined by said collar and intermediate said open end and said aperture; and
   an inlet tube disposed through said aperture, and wherein said diverting element is disposed proximate said inlet tube.

28. The apparatus of claim 27 wherein said continuously increasing cross-sectional diameter comprises an exponentially increasing diameter.

29. The apparatus of claim 27 wherein said continuously increasing cross-sectional diameter comprises a linearly diameter.

30. An apparatus for distributing gas to a workpiece, said workpiece having a selected diameter, comprising:
   a member having an aperture for receiving a gas;
   a collar in communication with said aperture, said collar comprising a section having a continuously increasing cross-sectional diameter from a first predetermined point to a second predetermined point and operable to direct gas received from said aperture to the workpiece; and
   a diverting element within an interior defined by said collar, wherein said diverting element comprises:
      a frusto-conical section having a smaller diameter end toward the aperture and a larger diameter end toward the workpiece; and
      a circularly cylindrical section extending from said large diameter end toward the workpiece.

31. The apparatus of claim 30 wherein said continuously increasing cross-sectional diameter comprises an exponentially increasing diameter.

32. The apparatus of claim 30 wherein said continuously increasing cross-sectional diameter comprises a linearly increasing diameter.

33. An apparatus for distributing gas to a workpiece, said workpiece having a selected from diameter, comprising:
   a member having an aperture for receiving a gas;
   a collar in communication with said aperture, said collar comprising a section having a continuously increasing cross-sectional diameter from a first predetermined point to a second predetermined point and operable to direct gas received from said aperture to the workpiece; and
   a diverting element disposed within an interior defined by said collar and intermediate said open and said aperture wherein said diverting element is hollow such that a portion of gas received from said aperture may pass therethrough and toward the workpiece.

34. The apparatus of claim 33 wherein said continuously increasing cross-sectional diameter comprises an exponentially increasing diameter.

35. The apparatus of claim 33 wherein said continuously increasing cross-sectional diameter comprises a linearly increasing diameter.

* * * * *